(12) United States Patent
Black et al.

(10) Patent No.: US 8,673,777 B2
(45) Date of Patent: Mar. 18, 2014

(54) IN-LINE DEPOSITION SYSTEM AND PROCESS FOR DEPOSITION OF A THIN FILM LAYER

(75) Inventors: Russell Weldon Black, Longmont, CO (US); Scott Daniel Feldman-Peabody, Golden, CO (US); Christopher Rathweg, Boulder, CO (US)

(73) Assignee: First Solar, Inc., Tempe, AZ (US)

( * ) Notice: Subject to any disclaimer, the term of this patent is extended or adjusted under 35 U.S.C. 154(b) by 35 days.

(21) Appl. No.: 13/249,818

(22) Filed: Sep. 30, 2011

(65) Prior Publication Data
US 2013/0084669 A1 Apr. 4, 2013

(51) Int. Cl.
*H01L 21/44* (2006.01)
(52) U.S. Cl.
USPC ............................................. 438/679; 438/61
(58) Field of Classification Search
USPC .................................................. 438/61, 679
See application file for complete search history.

(56) References Cited

U.S. PATENT DOCUMENTS

| | | | |
|---|---|---|---|
| 3,563,202 | A | 2/1971 | Mackrael et al. |
| 5,248,349 | A | 9/1993 | Foote et al. |
| 5,304,499 | A | 4/1994 | Bonnet et al. |
| 5,366,764 | A | 11/1994 | Sunthankar |
| 5,712,187 | A | 1/1998 | Li et al. |
| 5,994,642 | A | 11/1999 | Higuchi et al. |
| 6,423,565 | B1 | 7/2002 | Barth et al. |
| 6,444,043 | B1 | 9/2002 | Gegenwart et al. |
| 6,719,848 | B2 | 4/2004 | Faykosh et al. |
| 7,194,197 | B1 | 3/2007 | Wendt et al. |
| 7,749,480 | B2 | 7/2010 | Audet et al. |
| 7,939,363 | B1 * | 5/2011 | Johnson et al. ................. 438/87 |
| 2002/0117199 | A1 | 8/2002 | Oswald |
| 2003/0044539 | A1 | 3/2003 | Oswald |
| 2005/0158891 | A1 * | 7/2005 | Barth et al. ..................... 438/22 |
| 2007/0224812 | A1 * | 9/2007 | Fujinawa et al. ............. 438/680 |
| 2009/0194165 | A1 | 8/2009 | Murphy et al. |

FOREIGN PATENT DOCUMENTS

| | | |
|---|---|---|
| EP | 0326919 A2 | 8/1989 |
| EP | 0853345 A1 | 7/1998 |
| EP | 2383365 A1 | 2/2011 |
| EP | 2337092 A1 | 6/2011 |

OTHER PUBLICATIONS

PCT Search Report and Written Opinion dated Feb. 12, 2013 from corresponding Application No. PCT/US2012/057884.

* cited by examiner

*Primary Examiner* — Ajay K Arora
(74) *Attorney, Agent, or Firm* — MacMillan, Sobanski & Todd, LLC

(57) ABSTRACT

An apparatus for vapor deposition of a sublimated source material as a thin film on a substrate is provided. The apparatus includes a receptacle configured to hold a source material and a distribution plate positioned above the receptacle. The distribution plate defines a pattern of passages therethrough. The apparatus also includes a conveyor configured to travel in a continuous loop such that its transfer surface passes above the distribution plate in a first direction to receive thereon sublimated source material passing through the passages of the distribution plate. The conveyor is also configured to travel in a second direction while carrying a substrate on its raised edges. A heating system heats the conveyor while it travels in the second direction to transfer the source material from the transfer surface to the substrate. A process is provided for vapor deposition of a sublimated source material to form thin film.

16 Claims, 4 Drawing Sheets

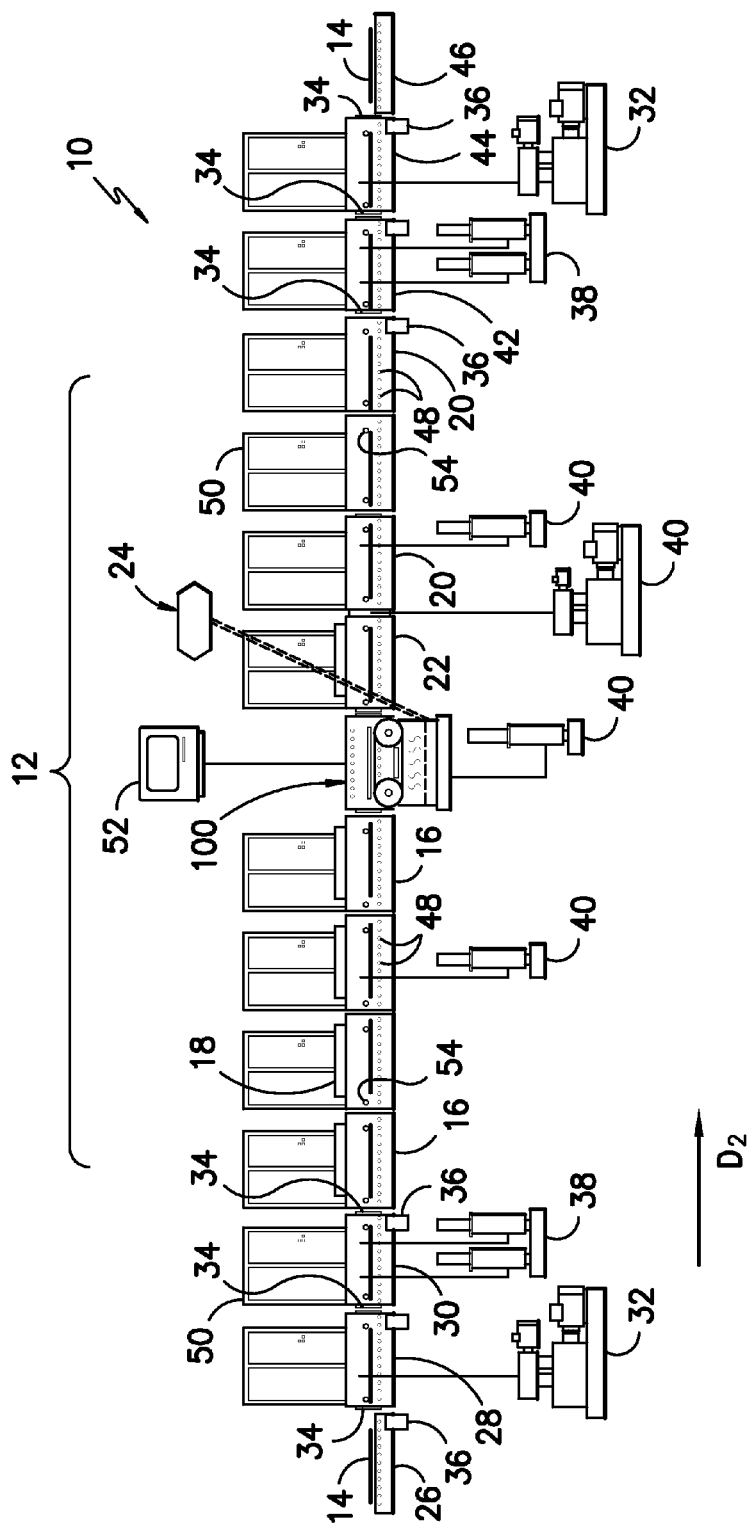
FIG. -1-

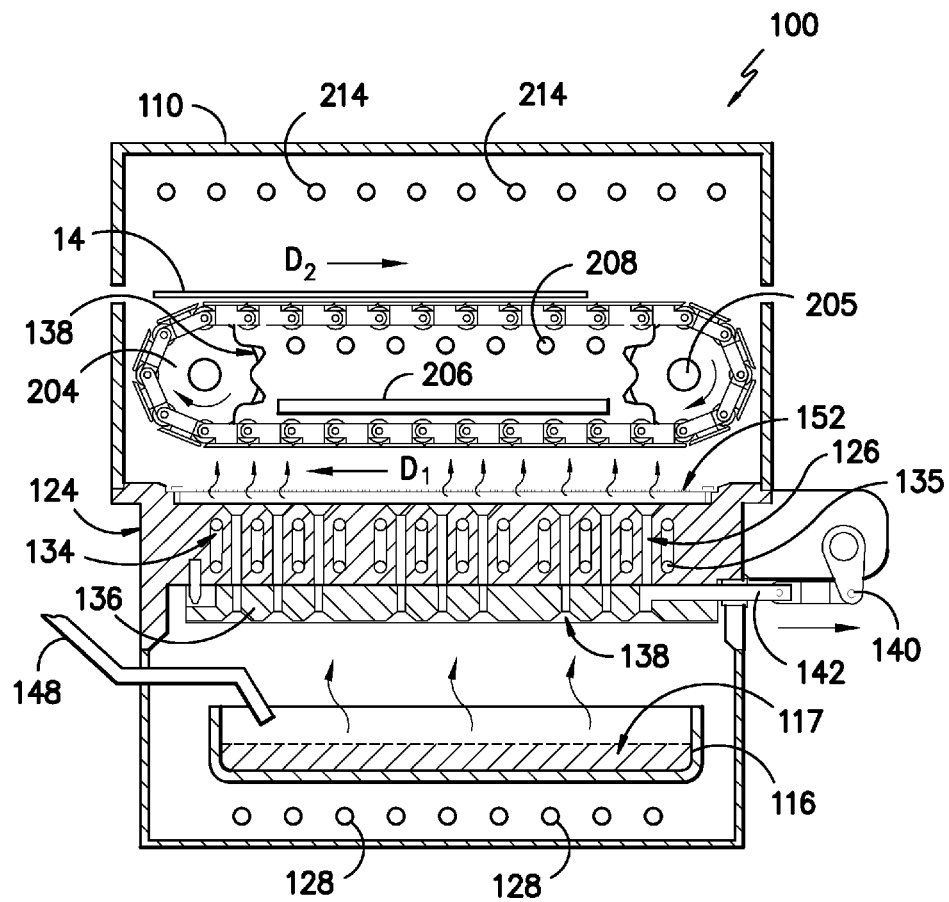
FIG. -2-

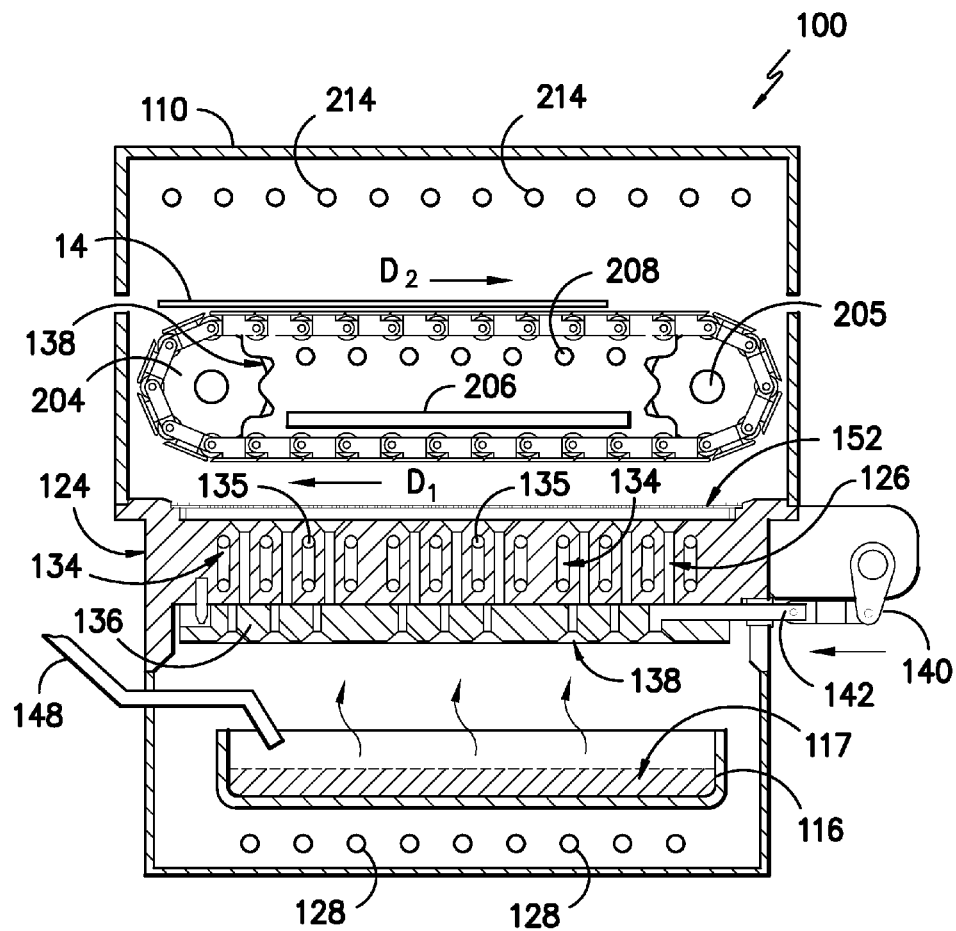
FIG. -3-

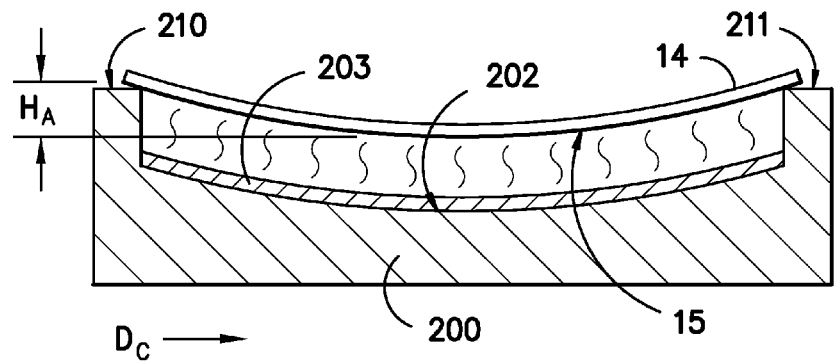
FIG. -4-
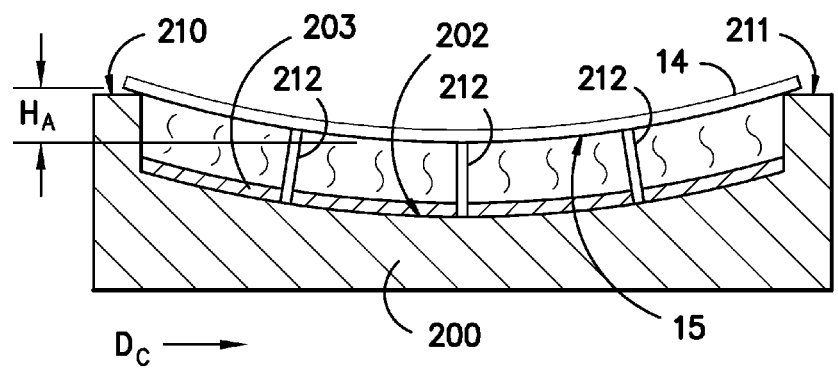
FIG. -5-

IN-LINE DEPOSITION SYSTEM AND PROCESS FOR DEPOSITION OF A THIN FILM LAYER

FIELD OF THE INVENTION

The subject matter disclosed herein relates generally to the field of thin film deposition processes wherein a thin film layer, such as a semiconductor material layer, is deposited on a substrate. More particularly, the subject matter is related to a vapor deposition apparatus and associated process for depositing a thin film layer of a photo-reactive material (e.g., CdTe) on a glass substrate in the formation of photovoltaic (PV) modules.

BACKGROUND OF THE INVENTION

Solar energy systems using cadmium telluride (CdTe) photovoltaic (PV) modules are generally recognized as the most cost efficient of the commercially available systems in terms of cost per watt of power generated. However, the advantages of CdTe not withstanding, sustainable commercial exploitation and acceptance of solar power as a supplemental or primary source of industrial or residential power depends on the ability to produce efficient PV modules on a large scale and in a cost effective manner.

Certain factors greatly affect the efficiency of CdTe PV modules in terms of cost and power generation capacity. For example, CdTe is relatively expensive and, thus, efficient utilization (i.e., minimal waste) of the material is a primary cost factor. In addition, the energy conversion efficiency of the module is a factor of certain characteristics of the deposited CdTe film layer. Non-uniformity or defects in the film layer can significantly decrease the output of the module, thereby adding to the cost per unit of power. Also, the ability to process relatively large substrates on an economically sensible commercial scale is a crucial consideration.

CSS (Closed System Sublimation) is a known commercial vapor deposition process for production of CdTe modules. Reference is made, for example, to U.S. Pat. Nos. 6,444,043 and 6,423,565. Within the vapor deposition chamber in a CSS system, the substrate is brought to an opposed position at a relatively small distance (i.e., about 2-3 mm) opposite to a CdTe source. The CdTe material sublimes and deposits onto the surface of the substrate. In the CSS system of U.S. Pat. No. 6,444,043 cited above, the CdTe material is in granular form and is held in a heated receptacle within the vapor deposition chamber. The sublimated material moves through holes in a cover placed over the receptacle and deposits onto the stationary glass surface, which is held at the smallest possible distance (1-2 mm) above the cover frame. It is understood that CSS is a type of diffusive transport deposition (DTD) system, and diffusive transport deposition systems, more broadly, need not necessarily qualify as "close spaced" in nature.

A constant supply of CdTe vapors through the hole plate creates a uniform vapor pressure for deposition onto the substrate. Thus, the deposition rate for the entire CdTe layer can be substantially constant, in an effort to ensure that a substantially uniform thin film layer is formed on the substrate. However, if the initial deposition rate it too fast, voids (i.e., small areas free from CdTe) can be created during the initial deposition. These voids can be exaggerated as the deposition process continues.

Additionally, due to the relatively high temperatures involved in the CSS deposition process, the substrate (e.g., a glass superstrate) can be heated to temperatures that can cause an unregulated curved gradient (e.g., warpage) across the face (i.e., the deposition surface) of the substrate. This unregulated curved gradient can add additional variables into the deposition process. For example, a unregulated curved gradient can induce tensions in the substrate, which can lead to damage in the substrate and/or in the thin film formed thereon. Such curved gradients can be particularly problematic when the substrate has a large surface area and is relatively thin, (e.g., on a glass superstrate of a PV module).

Accordingly, there exists an ongoing need in the industry for an improved vapor deposition apparatus and process for economically feasible large scale production of efficient PV modules, particularly CdTe modules. In particular, a need exists for an improved sublimation plate for use in an economically feasible large scale production of efficient PV modules, particularly CdTe modules, in a CSS process.

BRIEF DESCRIPTION OF THE INVENTION

Aspects and advantages of the invention will be set forth in part in the following description, or may be obvious from the description, or may be learned through practice of the invention.

An apparatus is generally provided for vapor deposition of a sublimated source material as a thin film on a substrate. In one embodiment, the apparatus can include a receptacle configured to hold a source material and a distribution plate positioned above the receptacle. The distribution plate can define a pattern of passages therethrough. The apparatus can also include a conveyor defining a pair of raised edges and a transfer surface and configured to travel in a continuous loop such that the transfer surface passes above the distribution plate in a first direction to receive thereon sublimated source material passing through the passages of the distribution plate. The conveyor can also be configured to travel in a second direction while carrying a substrate on the raised edges. A heating system can be included to be configured to heat the conveyor while it travels in the second direction.

A process is also generally provided for vapor deposition of a sublimated source material to form thin film on a substrate. In one embodiment, the process can include sublimating a source material such that source vapors pass through a plurality of passages defined in a deposition plate. A conveyor can be moved around a continuous loop, wherein the conveyor defines a pair of raised edges and a transfer surface. The source vapors can be deposited onto the transfer surface of the conveyor as the conveyor travels in a first direction above the distribution plate. The substrate can be carried on the raised edges of the conveyor in a second direction, and the conveyor can be heated while it travels in the second direction carrying the substrate such that the deposited source vapors on the transfer surface of the conveyor transfers to the substrate.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1 is a plan view of a system that may incorporate embodiments of a vapor deposition apparatus of the present invention;

FIG. 2 is a cross-sectional view of an embodiment of a vapor deposition apparatus according to aspects of the invention in a first operational configuration;

FIG. 3 is a cross-sectional view of the embodiment of FIG. 2 in a second operational configuration and in cooperation with a substrate conveyor;

FIG. 4 is a cross-sectional view of one embodiment of a conveyor for use in the vapor deposition apparatus of FIG. 2 (from a side view that is 90° to the view of FIG. 2); and, FIG. 5 is a cross-sectional view of another embodiment of a conveyor for use in the vapor deposition apparatus of FIG. 2 (from a side view that is 90° to the view of FIG. 2).

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers, unless otherwise stated. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "µm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

FIG. 1 illustrates an embodiment of a system 10 that may incorporate a vapor deposition apparatus 100 (FIGS. 2-3), which may be described as a diffusive transport deposition system, in accordance with embodiments of the invention configured for deposition of a thin film layer on an arcuate surface 15 of a photovoltaic (PV) substrate 14 (referred to hereafter as a "substrate"). The thin film may be, for example, a film layer of cadmium telluride (CdTe). As mentioned, it is generally recognized in the art that a "thin" film layer on a PV module substrate is generally less than about 10 microns (µm).

FIGS. 2-3 relate to a particular embodiment of the vapor deposition apparatus 100. Referring to FIGS. 2 and 3 in particular, the apparatus 100 includes a deposition head 110 defining an interior space in which a receptacle 116 is configured for receipt of a granular source material. As mentioned, the granular source material may be supplied by a feed device or system 24 (FIG. 1) via a feed tube 148 (FIG. 2-3). The receptacle 116 has an open top and may include any configuration of internal ribs (not shown) or other structural elements.

In one embodiment, at least one thermocouple (not shown) can be operationally disposed in the deposition head 110 to monitor temperature within the deposition head 110 adjacent to or in the receptacle 116.

Heater elements 128 are disposed below the receptacle 116. These heater elements 128 may take on various configurations within the scope and spirit of the invention, and serves to heat the receptacle 116. As such, heater elements 128 serve to heat the receptacle 116 to a degree sufficient for heating the source material 117 therein, causing sublimation of the source material 117. The heat generated by the heater elements 128 is also sufficient to prevent the sublimated source material from condensing onto components of the head chamber 110. Desirably, the coolest component in the head chamber 110 is the transfer surface 202 of the conveyor 200, when traveling in the first direction $D_1$, so as to ensure that the sublimated source material plates onto the transfer surface 202, and not onto components of the head chamber 110.

In the illustrated embodiment, a distribution plate 152 is disposed above the receptacle 116 at a defined distance below the transfer surface 202 of the conveyor 200, as depicted in FIGS. 2-3. This distance may be, for example, between about 0.3 cm to about 4.0 cm. In a particular embodiment, the distance is about 1.0 cm to about 2.0 cm.

As previously mentioned, the sublimated source material will flow out of the receptacle 116, diffuse through the distribution plate 152, and deposit on the transfer surface 202 of the conveyor 200. The holes in the distribution plate 152 help ensure a relatively uniform distribution of the sublimated source material on the transfer surface 202 of the conveyor 200. As stated, the conveyor 200 travels in a continuous loop around the drive rolls 204, 205, with the conveyor traveling in a first direction $D_1$ when the transfer surface 202 faces the distribution plate 152 for plating of the sublimated source material thereon.

A cooling system 206 is positioned adjacent to the conveyor 200 when traveling in the first direction $D_1$ to cool the conveyor 200 while it travels in the first direction $D_1$. As such, the transfer surface 202 of the conveyor 200 when traveling in the first direction $D_1$ can be at a temperature low enough to cause plating of the sublimated source material thereon to form a plated source material layer 203 on the transfer surface 202. For example, the plating temperature of the transfer surface 202 can be about 350° C. to about 500° C. (e.g., about 375° C. to about 450° C.), particularly when the source material includes cadmium telluride.

Then, the conveyor 200 with the plated source material 203 on the transfer surface travels around the drive roll 205, and in a second direction $D_2$ to carrying a substrate 14 through the apparatus 100 with its arcuate surface 15 facing the transfer surface 202 of the conveyor 204. As shown, the first direction $D_1$ and the second direction $D_2$ are substantially opposite from each other.

A heating system 208 is positioned adjacent to the conveyor 200 when it travels in the second direction $D_2$ in order to heat the transfer surface 202 of the conveyor 200 to a temperature sufficient to sublimate the plated source material 203 thereon (i.e., resublimate the source material). As such, the resublimated source material can deposit on the arcuate surface 15 of the substrate 14 facing the transfer surface 202 of the conveyor 200. For example, the transfer surface 205 can have a transfer temperature when traveling in the second direction of about 500° C. to about 700° C., such as about 525° C. to about 650° C., particularly when the source material includes cadmium telluride.

In particular embodiments, the average deposition rate of the entire deposited thin film layer (e.g., a CdTe layer) on the arcuate surface 15 can be about 5 μm/minute to about 50 μm/minute forming a CdTe layer having a thickness of about 1 μm to about 5 μm (e.g., about 2 μm to about 4 μm).

Referring to FIG. 4, the conveyor 200 defines a pair of raised edges 210, 211 for supporting the substrate 14 thereon. The raised edges 210, 211 are positioned on either side of the transfer surface 202. When carrying the substrates 14 with the lower surface 15 of the substrate 14 facing the transfer surface 202 of the conveyor 200, the substrates 14 respectively define an arc for deposition thereon. The arcuate surface 15 can allow for control of any curve gradient in the substrate 14, which can be induced through heating the substrate 14. As used herein, the terms "arc" and "arcuate" describe a curved, bent, bowed, or otherwise rounded shape, but does not necessarily mean a portion of a circle.

The arcuate surface 15 can be induced in the substrate 14 during heating of the substrate 14 (e.g., through a series of heater modules 16) prior to passage into the vapor deposition apparatus 100 or during passage into the vapor deposition apparatus 100. In one particular embodiment, the substrates 14 can enter and exit the apparatus 100 as a substantially flat substrate 14 (i.e., without any bending forces applied to the substrate 12 other than the normal bending stresses caused through heating a sheet of glass on a flat support), and can be deformed within the apparatus 100 to become arcuate during deposition of a thin film in the vapor deposition apparatus 100, and can return to its substantially flat shape during cooling of the substrates 14 through supporting the entire substrate (e.g., with a conveyor belt, plurality of rollers, etc.).

As shown, the substrates 14 are transported on the raised surfaces 210, 211 of the conveyor 200 when moving in the second direction $D_2$ (which is the machine direction) through the vapor deposition apparatus 100. Each of the substrates 14 define an arcuate surface 15 in the cross-direction $D_C$, which is substantially perpendicular to the first direction $D_1$ and the second direction $D_2$. In this configuration, the weight of the substrate 14 itself, in combination with the elevated substrate temperature, can allow for the substrate 14 to sag or otherwise deform to form the arcuate surface 15. As shown in FIG. 4, the substrate 14 can be allowed to sag on its own weight, controlled by the positioning of the raised edges 210, 211 of the conveyor 200 between the lateral edges of the substrate 14 and/or the substrate temperature. For example, FIG. 4 shows the substrate 14 only supported at its lateral edges to allow the arcuate surface 15 to form by sagging of the middle portion between the lateral edges.

Alternatively, FIG. 5 shows an embodiment where the amount of bending in the arcuate surface 15 is further controlled by the inclusion of additional support members 212 under the middle portion of the substrate 14 between the lateral edges. When used, such support members 212 can limit the amount of curvature formed in the arcuate surface 15 of the substrate 14. The support members 212 can be generally small with a defined point that contacts the arcuate surface 15, so as to limit the surface area of the arcuate surface 15 that contacts the support members 212.

The arcuate surface 15 can define an arc that has a height ($H_A$), which is a measure of the distance from one lateral edge (as the highest point in the z-direction) to the middle portion (as the lowest point in the z-direction) in a z-direction that is perpendicular to both the machine direction $D_2$ and the cross-direction $D_C$. In most embodiments, the arc height $H_A$ can be greater than the thickness of the substrate 14. However, the arc height $H_A$ may be a function of the size (i.e., length in the cross-direction) of the substrate 14. For example, for substrates 14 having a length of about 1000 mm to about 1200 mm in the cross-direction and a thickness of about 0.7 mm to about 2 mm in the z-direction, the arc height can be about 5 mm to about 10 mm.

In one particular embodiment, the transfer surface 202 of the conveyor 200 can be bowed such that the distance gradient between the transfer surface 202 and the arcuate surface 15 of the substrate 14 is minimized. Referring to FIG. 4, the transfer surface 202 of the conveyor 200 is shaped to be concave such that the difference in the distance from the transfer surface 202 of the conveyor 200 to the arcuate surface 15 of the substrate 14 at any point is within a desired range. For instance, the distance between the transfer surface 202 of the conveyor 200 and the arcuate surface 15 at any point, as measured in the z-direction, can be within about 10% of the minimum distance (i.e., the closest point of the arcuate surface 15 and the transfer surface 202 of the conveyor 200). In one particular embodiment, the transfer surface 202 of the conveyor 200 can be substantially parallel to the arcuate surface 15 defined by the substrate 14 such that substantially no distance gradient is present between the arcuate surface 15 and the transfer surface 202 of the conveyor 200.

The conveyor 200 can be constructed from any suitable material that is capable of operating in the deposition conditions, including repeated heating and cooling of the conveyor 200 as it travels in the continuous loop. For example, the conveyor 200 may include a plurality of interconnected slats to define a substantially continuous transfer surface 202 when traveling in either the first or second direction. In one particular embodiment, the conveyor 200 can be constructed from a graphite material.

The drive rolls 204, 205 are generally configured to rotate in a manner that causes the conveyor 200 to travel in its continuous loop. Either or both of the drive rolls 204, 205 can be driven by a motor (not shown) or other power source to rotate the drive rolls 204, 205 at a desired speed. In one embodiment, the conveyor 202 may include sprockets 138 that define teeth or cogs that engage with the conveyor 200. Any number of drive rolls 204, 205 can be used to move the conveyor 200 in its continuous loop.

The conveyance rate of the substrates 14 on the conveyor 200 may be in the range of, for example, about 10 mm/sec to about 40 mm/sec. In a particular embodiment, this rate may be, for example, about 20 mm/sec. The thickness of the CdTe film layer that plates onto the arcuate surface 15 of the substrate 14 can vary within the scope and spirit of the invention, and may be, for example, between about 1 micron to about 5 microns. In a particular embodiment, the film thickness may be about 3 microns.

As shown in FIGS. 2-3, second heating elements 214 can be positioned in the apparatus 100 to heat the substrates 14 as they are carried by the conveyor 200 in the second direction $D_2$.

Referring to FIGS. 2 and 3, the illustrated embodiment includes a heated distribution manifold 124 which may be optionally disposed above the receptacle 116, between the receptacle 116 and the distribution plate 152. The heated distribution manifold 124 may take on various configurations within the scope and spirit of the invention, and serves to heat the source material in the receptacle 116 and other components in the apparatus 100 (e.g., the distribution plate 152), as well as distribute the sublimated source material that flows from the receptacle 116.

In the illustrated embodiment, the heated distribution manifold 124 has a configuration that includes recesses therein that define cavities 134. Heater elements 135 are disposed within the cavities 134 and serve to heat the distribution manifold 124 to a degree sufficient for indirectly heating the source material within the receptacle 116 to cause sublimation of the source material. The heater elements 135 may be made of a material that reacts with the source material vapor and, in this regard, the heated distribution manifold 124 also serves to isolate the heater elements 135 from contact with the source material vapor. The heat generated by the distribution manifold 124 is also sufficient to prevent the sublimated source material from plating out onto components of the head chamber 110.

Still referring to FIGS. 2 and 3, the heated distribution manifold 124 includes a plurality of passages 126 defined therethrough. These passages 126 have a shape and configuration so as to uniformly distribute the sublimated source material towards the distribution plate 152.

The illustrated embodiment of FIGS. 2 and 3 also includes an optional movable shutter plate 136 disposed below the distribution manifold 124. This shutter plate 136 includes a plurality of passages 138 defined therethrough that align with the passages 126 in the distribution manifold 124 in a first operational position of the shutter plate 136 as depicted in FIG. 2. As can be readily appreciated from FIG. 2, in this operational position of the shutter plate 136, the sublimated source material is free to flow through the shutter plate 136 and through the passages 126 in the distribution manifold 124 for subsequent distribution through the plate 152. Referring to FIG. 3, the shutter plate 136 is movable to a second operational position relative to the upper surface of the distribution manifold 124 wherein the passages 138 in the shutter plate 136 are misaligned with the passages 126 in the distribution manifold 124. In this configuration, the sublimated source material is blocked from passing through the distribution manifold 124, and is essentially contained within the interior volume of the head chamber 110. Any suitable actuation mechanism, generally 140, may be configured for moving the shutter plate 136 between the first and second operational positions. In the illustrated embodiment, the actuation mechanism 140 includes a rod 142 and any manner of suitable linkage that connects the rod 142 to the shutter plate 136. The rod 142 is rotated by any manner of mechanism located externally of the head chamber 110.

The shutter plate 136 configuration illustrated in FIGS. 2 and 3 is particularly beneficial in that, as desired, the sublimated source material can be quickly and easily contained within the head chamber 110 and prevented from passing through to the deposition area above the conveying unit. This may be desired, for example, during start-up of the system 10 while the concentration of vapors within the head chamber builds to a sufficient degree to start the deposition process. Likewise, during shutdown of the system, it may be desired to maintain the sublimated source material within the head chamber 110 to prevent the material from condensing on the conveyor or other components of the apparatus 100.

The distribution plate 152 defines a pattern of passages, such as holes, slits, and the like, therethrough that further distribute the sublimated source material passing through the distribution manifold 124 such that the source material vapors are uninterrupted in the transverse direction T. In other words, the pattern of passages are shaped and staggered or otherwise positioned to ensure that the sublimated source material is deposited completely over the substrate in the transverse direction so that longitudinal streaks or stripes of "un-coated" regions on the substrate are avoided.

During use, the distribution plate 152 is heated (e.g., by the heated distribution manifold 124) to a temperature above the temperature of the substrate 14 to ensure that no material deposits and builds up on the distribution plate 152. For example, when depositing a thin film cadmium telluride layer, the substrate 14 may be heated to a substrate temperature between about 550° C. and about 700° C. (e.g., between about 600° C. and about 650° C.) while the distribution plate may be heated to a plate temperature above about 725° C., such as from about 750° C. to about 900° C. (e.g., from about 800° C. to about 850° C.).

It should be appreciated that the present vapor deposition apparatus 100 is not limited to use in the system 10 illustrated in FIG. 1, but may be incorporated into any suitable processing line configured for vapor deposition of a thin film layer onto a PV module substrate 14. For reference and an understanding of an environment in which the vapor deposition apparatus 100 may be used, the system 10 of FIG. 1 is described below.

Referring to FIG. 1, the exemplary system 10 includes a vacuum chamber 12 defined by a plurality of interconnected modules, including a plurality of heater modules 16 that define a pre-heat section of the vacuum chamber 12 through which the substrates 14 are conveyed and heated to a desired temperature before being conveyed into the vapor deposition apparatus 100. Each of the modules 16 may include a plurality of independently controlled heaters 18, with the heaters defining a plurality of different heat zones. A particular heat zone may include more than one heater 18.

The vacuum chamber 12 also includes a plurality of interconnected cool-down modules 20 downstream of the vapor deposition apparatus 100. The cool-down modules 20 define a cool-down section within the vacuum chamber 12 through which the substrates 14 having the thin film of sublimated source material deposited thereon are conveyed and cooled at a controlled cool-down rate prior to the substrates 14 being removed from the system 10. Each of the modules 20 may include a forced cooling system wherein a cooling medium, such as chilled water, refrigerant, or other medium, is pumped through cooling coils (not illustrated) configured with the modules 20.

In the illustrated embodiment of system 10, at least one post-heat module 22 is located immediately downstream of the vapor deposition apparatus 100 and upstream of the cool-down modules 20 in a conveyance direction of the substrates. As the leading section of a substrate 14 is conveyed out of the vapor deposition apparatus 100, it moves into the post-heat module 22, which maintains the temperature of the substrate 14 at essentially the same temperature as the trailing portion of the substrate still within the vapor deposition apparatus 100. In this way, the leading section of the substrate 14 is not allowed to cool while the trailing section is still within the vapor deposition apparatus 100. If the leading section of a substrate 14 were allowed to cool as it exited the apparatus 100, a non-uniform temperature profile would be generated longitudinally along the substrate 14. This condition could result in the substrate breaking from thermal stress.

As diagrammatically illustrated in FIG. 1, a feed device 24 is configured with the vapor deposition apparatus 100 to supply source material, such as granular CdTe. The feed device 24 may take on various configurations within the scope and spirit of the invention, and functions to supply the source material without interrupting the continuous vapor deposition process within the apparatus 100 or conveyance of the substrates 14 through the apparatus 100.

Still referring to FIG. 1, the individual substrates 14 are initially placed onto a load conveyor 26, and are subsequently moved into an entry vacuum lock station that includes a load module 28 and a buffer module 30. A "rough" (i.e., initial) vacuum pump 32 is configured with the load module 28 to draw an initial vacuum, and a "fine" (i.e., final) vacuum pump 38 is configured with the buffer module 30 to increase the vacuum in the buffer module 30 to essentially the vacuum pressure within the vacuum chamber 12. Slide gates or valves 34 are operably disposed between the load conveyor 26 and the load module 28, between the load module 28 and the buffer module 30, and between the buffer module 30 and the vacuum chamber 12. These valves 34 are sequentially actuated by a motor or other type of actuating mechanism 36 in order to introduce the substrates 14 into the vacuum chamber 12 in a step-wise manner without affecting the vacuum within the chamber 12.

In operation of the system 10, an operational vacuum is maintained in the vacuum chamber 12 by way of any combination of rough and/or fine vacuum pumps 40. In order to introduce a substrate 14 into the vacuum chamber 12, the load module 28 and buffer module 30 are initially vented (with the slide valve 34 between the two modules in the open position). The slide valve 34 between the buffer module 30 and the first heater module 16 is closed. The slide valve 34 between the load module 28 and load conveyor 26 is opened and a substrate 14 is moved into the load module 28. At this point, the first slide valve 34 is shut and the rough vacuum pump 32 then draws an initial vacuum in the load module 28 and buffer module 30. The substrate 14 is then conveyed into the buffer module 30, and the slide valve 34 between the load module 28 and buffer module 30 is closed. The fine vacuum pump 38 then increases the vacuum in the buffer module 30 to approximately the same vacuum in the vacuum chamber 12. At this point, the slide valve 34 between the buffer module 30 and vacuum chamber 12 is opened and the substrate 14 is conveyed into the first heater module 16.

An exit vacuum lock station is configured downstream of the last cool-down module 20, and operates essentially in reverse of the entry vacuum lock station described above. For example, the exit vacuum lock station may include an exit buffer module 42 and a downstream exit lock module 44. Sequentially operated slide valves 34 are disposed between the buffer module 42 and the last one of the cool-down modules 20, between the buffer module 42 and the exit lock module 44, and between the exit lock module 44 and an exit conveyor 46. A fine vacuum pump 38 is configured with the exit buffer module 42, and a rough vacuum pump 32 is configured with the exit lock module 44. The pumps 32, 38 and slide valves 34 are sequentially operated to move the substrates 14 out of the vacuum chamber 12 in a step-wise fashion without loss of vacuum condition within the vacuum chamber 12.

System 10 also includes a transport system (e.g., conveyors, rollers, etc.) configured to move the substrates 14 into, through, and out of the vacuum chamber 12. In the illustrated embodiment, this transport system includes a plurality of individually controlled conveyors 48, with each of the various modules including a respective one of the conveyors 48. It should be appreciated that the type or configuration of the conveyors 48 may vary. In the illustrated embodiment, the conveyors 48 are roller conveyors having rotatably driven rollers that are controlled so as to achieve a desired conveyance rate of the substrates 14 through the respective module and the system 10 overall.

As described, each of the various modules and respective conveyors in the system 10 are independently controlled to perform a particular function. For such control, each of the individual modules may have an associated independent controller 50 configured therewith to control the individual functions of the respective module. The plurality of controllers 50 may, in turn, be in communication with a central system controller 52, as diagrammatically illustrated in FIG. 1. The central system controller 52 can monitor and control (via the independent controllers 50) the functions of any one of the modules so as to achieve an overall desired heat-up rate, deposition rate, cool-down rate, conveyance rate, and so forth, in processing of the substrates 14 through the system 10.

Referring to FIG. 1, for independent control of the individual respective conveyors 48, each of the modules may include any manner of active or passive sensors 54 that detects the presence of the substrates 14 as they are conveyed through the module. The sensors 54 are in communication with the respective module controller 50, which is in turn in communication with the central controller 52. In this manner, the individual respective conveyor 48 may be controlled to ensure that a proper spacing between the substrates 14 is maintained and that the substrates 14 are conveyed at the desired conveyance rate through the vacuum chamber 12.

The present invention also encompasses various process embodiments for vapor deposition of a sublimated source material to form a thin film on a PV module substrate. The various processes may be practiced with the system embodiments described above or by any other configuration of suitable system components. It should thus be appreciated that the process embodiments according to the invention are not limited to the system configuration described herein.

In a particular embodiment, the vapor deposition process includes sublimating a source material such that source vapors pass through a plurality of passages defined in a deposition plate and moving a conveyor around a continuous loop. The conveyor generally defines a pair of raised edges and a transfer surface. The conveyor travels in a first direction such that the transfer surface passes above the distribution plate and receives source vapors thereon, and then the conveyor travels in a second direction while carrying a substrate on the raised edges. Heating the conveyor while it travels in the second direction carrying the substrate allows for transfer of the source material from the transfer surface to the substrate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An apparatus for vapor deposition of a sublimated source material as a thin film on a substrate, said apparatus comprising:
    a receptacle configured to hold a source material;
    a distribution plate positioned above the receptacle, wherein the distribution plate defines a pattern of passages therethrough;
    a conveyor defining a pair of raised edges and a transfer surface such that the raised edges are raised with respect to the transfer surface, wherein the conveyor is configured to travel in a continuous loop such that the transfer surface passes above the distribution plate in a first direction to receive thereon sublimated source material passing through the passages of the distribution plate, and wherein the conveyor is configured to travel in a second direction while carrying a substrate on the raised edges;
a heating system configured to heat the conveyor while it travels in the second direction; and
a cooling system configured to cool the conveyor while it travels in the first direction, wherein the heating system and the cooling system are positioned within the continuous loop defined by the conveyor.

2. The apparatus as in claim 1, wherein the conveyor is configured to support the substrate only along its raised edges.

3. The apparatus as in claim 1, further comprising:
a heating element positioned to sublimate the source material in the receptacle.

4. The apparatus as in claim 1, further comprising:
a shutter plate between the receptacle and the distribution plate, wherein the shutter plate is movable between an open position and a closed position.

5. The apparatus as in claim 1, further comprising:
a feed system configured to supply source material to the receptacle.

6. The apparatus as in claim 1, wherein the conveyor comprises graphite.

7. The apparatus as in claim 1, further comprising:
a second heating system configured to heat the substrate as it is being carried by the conveyor in the second direction.

8. An apparatus for vapor deposition of a sublimated source material as a thin film on a substrate, said apparatus comprising:
a receptacle configured to hold a source material;
a distribution plate positioned above the receptacle, wherein the distribution plate defines a pattern of passages therethrough;
a conveyor defining a pair of raised edges and a transfer surface such that the raised edges are raised with respect to the transfer surface, wherein the conveyor is configured to travel in a continuous loop such that the transfer surface passes above the distribution plate in a first direction to receive thereon sublimated source material passing through the passages of the distribution plate, and wherein the conveyor is configured to travel in a second direction while carrying a substrate on the raised edges; and
a heating system configured to heat the conveyer while it travels in the second direction,
wherein the substrate defines an arc when supported by the conveyor such that each lateral edge on a lower surface of the substrate is below a middle portion of the lower surface of the substrate, wherein the lower surface faces the transfer surface.

9. The apparatus as in claim 8, wherein the transfer surface of the conveyor defines an arc that is substantially parallel to the arc of the substrate.

10. A process for vapor deposition of a sublimated source material to form thin film on a substrate, the process comprising:
sublimating a source material such that source vapors pass through a plurality of passages defined in a deposition plate;
moving a conveyor around a continuous loop, wherein the conveyor defines a pair of raised edges and a transfer surface such that the raised edges are raised with respect to the transfer surface; depositing the source vapors onto the transfer surface of the conveyor as the conveyor travels in a first direction above the distribution plate;
carrying a substrate on the raised edges of the conveyor in a second direction;
heating the conveyor while it travels in the second direction carrying the substrate such that the deposited source vapors on the transfer surface of the conveyor transfers to the substrate; and
cooling the conveyor while it travels in the first direction, wherein the conveyor is cooled to a plating temperature while traveling in the first direction, wherein the plating temperature is about 350° C. to about 500° C.

11. The process as in claim 10, wherein the transfer surface of the conveyor has a transfer temperature when traveling in the second direction, wherein the transfer temperature is about 500° C. to about 650° C.

12. The process as in claim 10, wherein the substrate bends to define a concave arc while being carried by the conveyor such that each lateral edge on the upper surface of the substrate is above a middle portion of the upper surface of the substrate.

13. The process as in claim 12, wherein the transfer surface of the conveyor defines an arc that is substantially parallel to the concave arc of the substrate.

14. The process as in claim 12, further comprising:
transporting the substrates through a heating apparatus and onto the conveyor to heat the substrates to a deposition temperature, wherein the substrates are initially substantially planar and, upon heating, the substrates are deformed to define the arc.

15. The process as in claim 10, further comprising:
supplying additional source material to the receptacle via a feed system without interrupting the deposition process.

16. The process as in claim 10, wherein the substrate is supported by the conveyor only on its raised edges.

* * * * *